US012593575B2

(12) United States Patent
Li et al.

(10) Patent No.: US 12,593,575 B2
(45) Date of Patent: Mar. 31, 2026

(54) DISPLAY PANEL AND DISPLAY DEVICE

(71) Applicants:BOE TECHNOLOGY GROUP CO., LTD., Beijing (CN); HEFEI BOE JOINT TECHNOLOGY CO., LTD., Anhui (CN)

(72) Inventors: Yongqian Li, Beijing (CN); Zhidong Yuan, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 1015 days.

(21) Appl. No.: 17/770,650

(22) PCT Filed: May 26, 2021

(86) PCT No.: PCT/CN2021/096178
§ 371 (c)(1),
(2) Date: Dec. 1, 2022

(87) PCT Pub. No.: WO2022/246714
PCT Pub. Date: Dec. 1, 2022

(65) Prior Publication Data
US 2024/0155889 A1      May 9, 2024

(51) Int. Cl.
*H10K 59/131* (2023.01)
*H10K 59/121* (2023.01)
*H10K 59/80* (2023.01)

(52) U.S. Cl.
CPC ....... *H10K 59/131* (2023.02); *H10K 59/1213* (2023.02); *H10K 59/1216* (2023.02); *H10K 59/8792* (2023.02)

(58) Field of Classification Search
CPC ........... H10K 59/1216; H10K 59/1213; H10K 59/179; H10K 59/131
See application file for complete search history.

(56) References Cited

U.S. PATENT DOCUMENTS 9,559,690 B2    1/2017   Shengji et al.
10,050,061 B2   8/2018   Yuanbo et al.
(Continued)

FOREIGN PATENT DOCUMENTS

CN    102569187 A    7/2012
CN    103474436 A    12/2013
(Continued)

OTHER PUBLICATIONS

Written Opinion from PCT/CN2021/096178 dated Feb. 16, 2022.

*Primary Examiner* — Yuzhen Shen
(74) *Attorney, Agent, or Firm* — Calfee, Halter & Griswold LLP

(57) ABSTRACT

A display panel and a display device, wherein the display panel includes a display area and the display panel further includes: a base substrate, a third conductive layer, a pixel electrode layer, a common electrode layer, the third conductive layer is disposed at a side of the base substrate and includes a first conductive part in the display area. The pixel electrode layer is disposed at a side of the third conductive layer away from the base substrate, the common electrode layer is disposed at a side of the pixel electrode layer away from the base substrate, the common electrode layer includes at least a through-hole contacting part in the display area connected to the first conductive part via a first through hole.

19 Claims, 13 Drawing Sheets

(56)                    References Cited

U.S. PATENT DOCUMENTS

| | | | |
|---|---|---|---|
| 2016/0049424 A1 | 2/2016 | Yuanbo et al. | |
| 2016/0294386 A1 | 10/2016 | Shengji et al. | |
| 2018/0219056 A1* | 8/2018 | Han | H10K 50/171 |
| 2019/0081240 A1* | 3/2019 | Wei | H10K 59/80522 |
| 2020/0321427 A1 | 10/2020 | Hyun et al. | |
| 2021/0043713 A1* | 2/2021 | Sun | H10K 59/124 |

FOREIGN PATENT DOCUMENTS

| | | | | |
|---|---|---|---|---|
| CN | 102569187 | B | 8/2014 | |
| CN | 104022127 | A | 9/2014 | |
| CN | 108376672 | A | 8/2018 | |
| CN | 109524441 | A * | 3/2019 | G09F 9/301 |
| CN | 210428022 | U | 4/2020 | |
| CN | 111106130 | A | 5/2020 | |
| CN | 20200118315 | A | 10/2020 | |
| EP | 3151278 | A1 | 4/2017 | |
| EP | 3151278 | B1 | 4/2020 | |
| JP | 20190049754 | A | 3/2019 | |
| KR | 20160002570 | A | 1/2016 | |
| WO | 2013091298 | A1 | 6/2013 | |

* cited by examiner

51

1

DISPLAY PANEL AND DISPLAY DEVICE

CROSS REFERENCE

The present application is based upon International Application No. PCT/CN2021/096178, filed on May 26, 2021, and the entire contents thereof are incorporated herein by reference.

TECHNICAL FIELD

The present disclosure relates to the field of display technology, in particular, to a display panel and a display device.

BACKGROUND

In the OLED array substrate, the common cathode layer needs to be connected to the low-level power supply line located in the frame area via a through hole in the frame area of the array substrate.

It should be noted that, information disclosed in the above background portion is provided only for better understanding of the background of the present disclosure, and thus it may contain information that does not form the prior art known by those ordinary skilled in the art.

SUMMARY

According to one aspect, the present disclosure provides a display panel including a display area, wherein the display panel further includes a display area, and the display panel further includes: a base substrate, a third conductive layer, a pixel electrode layer, a common electrode layer, the third conductive layer is disposed at a side of the base substrate and includes a first conductive part in the display area. The pixel electrode layer is disposed at a side of the third conductive layer away from the base substrate, the common electrode layer is disposed at a side of the pixel electrode layer away from the base substrate, the common electrode layer includes at least a through-hole contacting part in the display area connected to the first conductive part via a first through hole.

In an exemplary embodiment of the present disclosure, the display panel further includes a pixel driving circuit, wherein the pixel driving circuit includes a driving transistor, and a first electrode of the driving electrode is connected to a first electrode of a light emitting unit, the pixel electrode layer includes a pixel electrode part configured to form the first electrode of the light emitting unit, wherein the display panel further includes: a second conductive layer, disposed between the base substrate and the third conductive layer, wherein the second conductive layer includes a second conductive part connected to the first electrode of the driving transistor, wherein a first opening is formed on the first conductive part, and an orthographic projection of the first opening on the base substrate is at least partly overlapped with an orthographic projection of the second conductive part on the base substrate, the pixel electrode part is connected to the second conductive part via a second through hole, and an orthographic projection of the second through hole on the base substrate is positioned within the orthographic projection of the first opening on the base substrate.

In an exemplary embodiment of the present disclosure, the display panel includes a plurality of pixel units, the common electrode layer includes a plurality of through-hole contacting parts, and each pixel unit is correspondingly disposed with one of the through-hole contacting part.

In an exemplary embodiment of the present disclosure, the pixel electrode layer is provided with a plurality of second openings, and the plurality of second openings are arranged in a one-to-one correspondence with the plurality of through-hole contacting parts, and the orthographic projection of the first through hole on the base substrate is located within the orthographic projection of a second opening corresponding to the first through hole on the base substrate, wherein the second opening corresponding to the through-hole contacting part is disposed corresponding to the first through hole connected to the through-hole contacting part.

In an exemplary embodiment of the present disclosure, each pixel unit includes a plurality of pixel driving circuits, and the plurality of pixel driving circuit includes a first pixel driving circuit, a second pixel driving circuit, a third pixel driving circuit, and a fourth pixel driving circuit sequentially arranged in a first direction; each pixel unit includes a plurality of pixel electrode parts, and the plurality of pixel electrode parts includes a first pixel electrode part, a second pixel electrode part, a third pixel electrode part and a fourth pixel electrode part; the first pixel driving circuit is connected to the first pixel electrode part, the second pixel driving circuit is connected to the second pixel electrode part, the third pixel driving circuit is connected to the third pixel electrode part, and the fourth pixel driving circuit is connected to the fourth pixel electrode part; and in a same pixel unit, the first pixel electrode part, the second pixel electrode part, the third pixel electrode part, and the fourth pixel electrode part are arranged in a two-by-two matrix.

In an exemplary embodiment of the present disclosure, in the same pixel unit: the first pixel electrode part and the third pixel electrode part are arranged adjacently in the first direction, the first pixel electrode part and the second pixel electrode part are arranged adjacently in a second direction, and the first direction is intersected with the second direction; a first notch is formed at a corner of the first pixel electrode part facing the third pixel electrode part and away from the second pixel electrode part; a second notch formed at a corner of the second pixel electrode part facing the fourth pixel electrode part and away from the first pixel electrode part; a third notch is formed at a corner of the third pixel electrode part facing the first pixel electrode part and away from the fourth pixel electrode part; a fourth notch formed at a corner of the fourth pixel electrode part facing the second pixel electrode part and away from the third pixel electrode part; and the plurality of pixel units includes a first pixel unit and a second pixel unit adjacent in the second direction, and wherein the first notch and the third notch of the first pixel unit is disposed adjacent to the second notch and the fourth notch of the second pixel unit, and the first notch and the third notch of the first pixel unit and the second notch and the fourth notch of the second pixel unit are configured to form the second opening.

In an exemplary embodiment of the present disclosure, the pixel electrode layer further includes: a transiting part, wherein an orthographic projection of the transiting part on the base substrate is within the orthographic projection of the second opening on base substrate, and the transiting part is connected to the first conductive part via a third through hole, wherein the through-hole contacting part is connected to the transiting part via the first through hole, to connect to the first conductive part.

In an exemplary embodiment of the present disclosure, both the orthographic projection of the first through hole on base substrate and the orthographic projection of the third through hole on base substrate have a square shape.

In an exemplary embodiment of the present disclosure, the first conductive part is overlapped on all area of the display panel other than an area where the first opening is located.

In an exemplary embodiment of the present disclosure, the display panel further including: an active layer, disposed between the base substrate and the second conductive layer, wherein the active layer includes a first active part including a first sub active part, wherein the first sub active part is configured to from a channel region of the driving transistor; and a light shielding layer, disposed between the base substrate and the active layer, wherein the light shielding layer includes a first light shielding part, and an orthographic projection of the light shielding part on the base substrate is covered on an orthographic projection of the first sub active part on the base substrate.

In an exemplary embodiment of the present disclosure, the pixel driving circuit further includes a capacitor, a first electrode of the capacitor is connected to the first electrode of the driving transistor, and a second electrode of the capacitor is connected to a gate electrode of the driving transistor, wherein the display panel further includes: a first conductive layer, disposed between the active layer and the second conductive layer, wherein the first conductive layer includes a third conductive part, an orthographic projection of the third conductive part on the base substrate is covered on an orthographic projection of the first active part on the base substrate, and the third conductive part is configured to form the gate electrode of the driving transistor, wherein the second conductive layer further includes: a fourth conductive part, connected to the third conductive part via a through hole, wherein the fourth conductive part is configured to form the second electrode of the capacitor, wherein the first active part further includes: a second sub active part, connected to the first sub active part, wherein an orthographic projection of the second sub active part on the base substrate is at least partly overlapped with an orthographic projection of the fourth conductive part on the base substrate, and the second sub active part is configured to form the first electrode of the capacitor.

In an exemplary embodiment of the present disclosure, the first light shielding layer is a conductive layer, an orthographic projection of the light shielding part on the base substrate is at least partly overlapped with an orthographic projection of the fourth conductive layer on the base substrate, and the second active part is connected to the first light shielding part via a through hole.

In an exemplary embodiment of the present disclosure, a second electrode of the driving transistor is connected to a first power supply terminal, and the active layer further includes: an active line, wherein an orthographic projection of the active line on the base substrate is extended in the first direction, the active line is connected to a plurality of first sub active part spaced along the first direction, and the active line is connected to a side of the first sub active part away from the second sub active part, wherein the second conductive layer further includes: a power supply line, configured to provide the first power supply terminal, wherein an orthographic projection of the power supply line on the base substrate is extended in the second direction, and the power supply line is connected to the active line via a though hole.

In an exemplary embodiment of the present disclosure, the second direction is a column direction, and wherein the display panel includes a plurality of columns of pixel units, and each column of the pixel units corresponds to one of the power supply line.

In an exemplary embodiment of the present disclosure, the second conductive layer includes a plurality of power supply lines, and the light shielding layer further includes: a plurality of first connecting lines, wherein an orthographic projection of each first connecting line on the base substrate is extended in the first direction and is spaced along the second direction, and each power supply line is connected to a same first connecting line via a though hole.

In an exemplary embodiment of the present disclosure, the pixel driving circuit further includes a first transistor, a first electrode of the first transistor is connected to the gate electrode of the driving transistor, and the active layer further includes: a second active part, wherein an orthographic projection of the second active part on the base substrate is at a side of the orthographic projection of the active line on the base substrate away from the orthographic projection of the fourth conductive part on the base substrate, and a part of the second active part is configured to form a channel region of the first transistor, wherein the second conductive layer further includes: a bridging part, the bridging part is connected to the fourth conductive part, and the bridging part is connected to the second active part via a through hole, wherein a size of an orthographic projection of the bridging part on the base substrate in the first direction is smaller than a size of the orthographic projection of the fourth conductive part on the base substrate in the first direction.

In an exemplary embodiment of the present disclosure, the active line includes a first active line and a second active line alternately connected in the first direction, a size of an orthographic projection of the first active line on the base substrate in the second direction is smaller than an orthographic projection of the second active line on the base substrate in the second direction, and the orthographic projection of the first active line on the base substrate is intersected with the orthographic projection of the bridging part on the base substrate.

In an exemplary embodiment of the present disclosure, the first driving circuit further includes a second transistor, a first electrode of the second transistor is connected to a reference signal terminal, a second electrode of the second transistor is connected to the first electrode of the driving transistor, and the first active part further includes: a third sub active part, connected to a side of the second sub active part away from the first sub active part, wherein the third sub active part is configured to form a channel region of the second transistor; and a fourth sub active part, connected to a side of the third sub active part away from the second sub active part, wherein the light shielding layer further includes: a plurality of second connecting segments, wherein the display panel includes a plurality of pixel units, and each pixel unit is provided with a corresponding second connecting segments, and wherein in a same pixel unit, each fourth sub active part is connected to its corresponding second connecting segment via a through hole, wherein the first conductive layer further includes: a fifth conductive part, connected to the second connecting segment via a through hole, and wherein the second conductive layer further includes: a reference signal line, connected to the fifth conductive part via a through hole, wherein the reference signal line is configured to provide the reference signal terminal.

In an exemplary embodiment of the present disclosure, a second electrode of the driving transistor is connected to a first power supply terminal, the pixel driving circuit further includes a first transistor and a second transistor, a first electrode of the first transistor is connected to a gate electrode of the driving transistor, a second electrode of the first transistor is connected to a data signal terminal, a first electrode of the second transistor is connected to a reference signal terminal, and a second electrode of the second transistor is connected to the first electrode of the driving transistor, the second conductive layer further includes: a power supply line, an orthographic projection of the power supply line on the base substrate is extended in a second direction, the power supply line is configured to provide the first power supply terminal, in the first direction, the orthographic projection of the power supply line on the base substrate is positioned between orthographic projections of adjacent two pixel units on the base substrate, and the first direction is intersected with the second direction; a first data line, wherein an orthographic projection of the first data line on the base substrate is extended in the second direction, the first data line is configured to provide the data signal terminal to a first pixel driving circuit, and the orthographic projection of the first data line on the base substrate is positioned between an orthographic projection of the first pixel driving circuit on the base substrate and an orthographic projection of a second pixel driving circuit on the base substrate; a second data line, wherein an orthographic projection of the second data line on the base substrate is extended in the second direction, the second data line is configured to provide the data signal terminal to the second pixel driving circuit, and the orthographic projection of the second data line on the base substrate is positioned between the orthographic projection of the first pixel driving circuit on the base substrate and the orthographic projection of the second pixel driving circuit on the base substrate; a third data line, wherein an orthographic projection of the third data line on the base substrate is extended in the second direction, the third data line is configured to provide the data signal terminal to a third pixel driving circuit, and the orthographic projection of the third data line on the base substrate is positioned between an orthographic projection of the third pixel driving circuit on the base substrate and an orthographic projection of a fourth pixel driving circuit on the base substrate; a fourth data line, wherein an orthographic projection of the fourth data line on the base substrate is extended in the second direction, the fourth data line is configured to provide the data signal terminal to the fourth pixel driving circuit, and the orthographic projection of the third data line on the base substrate is positioned between the orthographic projection of the third pixel driving circuit on the base substrate and the orthographic projection of the fourth pixel driving circuit on the base substrate; and a reference signal line, wherein an orthographic projection of the reference signal line on the base substrate is extended in the second direction, the reference signal line is configured to provide the reference signal terminal to a same pixel unit, and the orthographic projection of the reference signal line on the base substrate is positioned between the orthographic projection of the second pixel driving circuit on the base substrate and the orthographic projection of the third pixel driving circuit on the base substrate.

According to an aspect of the present disclosure, there is provided a display device including the above display panel.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Obviously, the drawings in the following description are only some embodiments of the present disclosure, and for those of ordinary skill in the art, other drawings can also be obtained from these drawings without creative effort.

DETAILED DESCRIPTION

Figure 1:
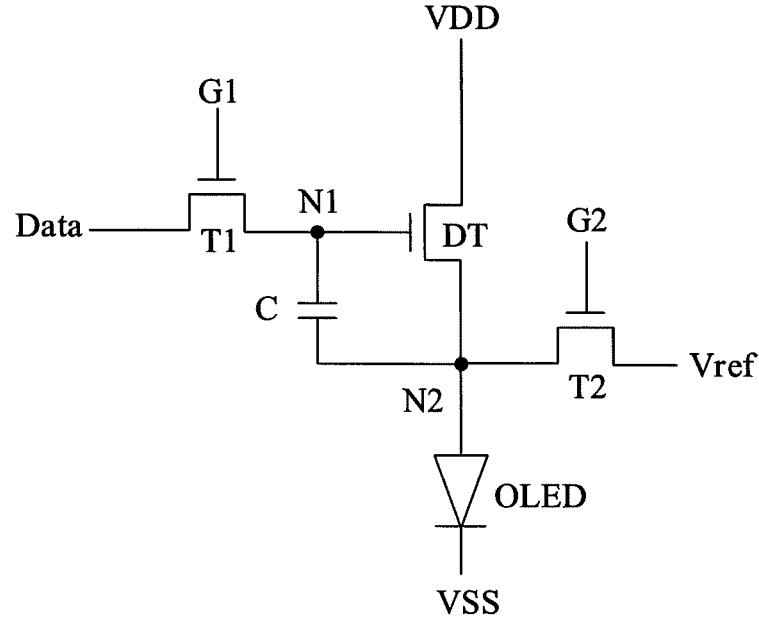
FIG. 1 is a schematic diagram of the circuit structure of the pixel driving circuit in the related art.

Example embodiments will now be described more fully with reference to the accompanying drawings. Example embodiments, however, can be embodied in various forms and should not be construed as limited to the examples set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted.

The terms "a", "an", "the" are used to indicate the presence of one or more elements/components/etc; and the terms "including" and "having" are used to indicate an open-ended inclusive meaning and means that additional elements/components/etc may be present in addition to the listed elements/components/etc.

As shown in FIG. 1, it is a schematic structural diagram of a pixel driving circuit in the related art. The display driving circuit includes a first transistor T1, a second transistor T2, a driving transistor DT, and a capacitor C. The first electrode of the first transistor T1 is connected to the first node N1, the second electrode of the first transistor is connected to the data signal terminal Data, and the gate electrode of the first transistor is connected to the first control terminal G1. The second electrode of the driving transistor DT is connected to the first power terminal VDD, the first electrode of the driving transistor DT is connected to the second node N2, and the gate electrode of the driving transistor DT is connected to the first node N1. The second electrode of the second transistor T2 is connected to the second node N2, and the first electrode of the second transistor T2 is connected to the reference signal terminal Vref. The capacitor C is connected between the second node and the first node. The pixel driving circuit may be used to provide driving current to the light emitting unit OLED, and the light emitting unit OLED may be connected between the second node N2 and the second power terminal VSS.

In the related art, the display panel may be integrated with a plurality of pixel driving circuits shown in FIG. 1. In the display panel, the cathode of the light emitting unit OLED is usually made into a common cathode. Generally, the common cathode is connected to a low-level power supply line supplying the second power source terminal VSS via a through hole in the frame area. However, due to the voltage drop of the common cathode itself, the potentials at different positions on the common cathode are not uniform, that is, the second power supply terminals in the pixel driving circuit at different positions have different potentials, so that when the same data signal is provided at the data signal terminal, the pixel driving circuit at different positions will have different driving currents, and the light emitting unit will emit light of different brightness, which will eventually cause the display panel to emit unevenly.

Figure 2:
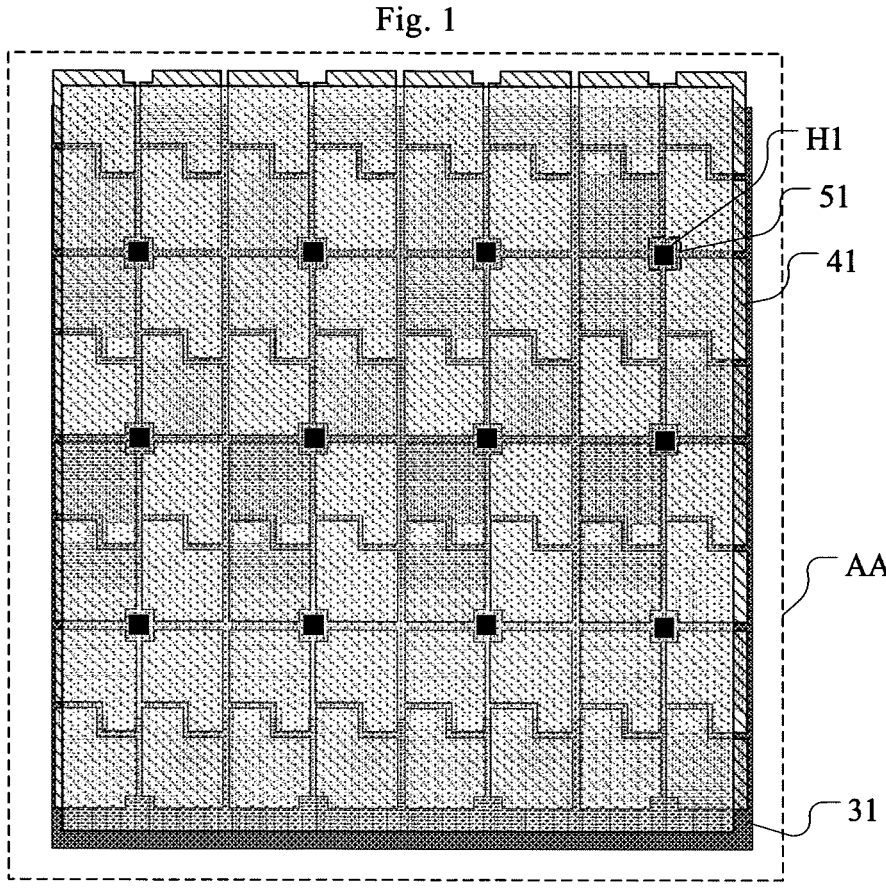
FIG. 2 is a structural diagram of an exemplary embodiment of the display panel of the present disclosure.
Figure 3:
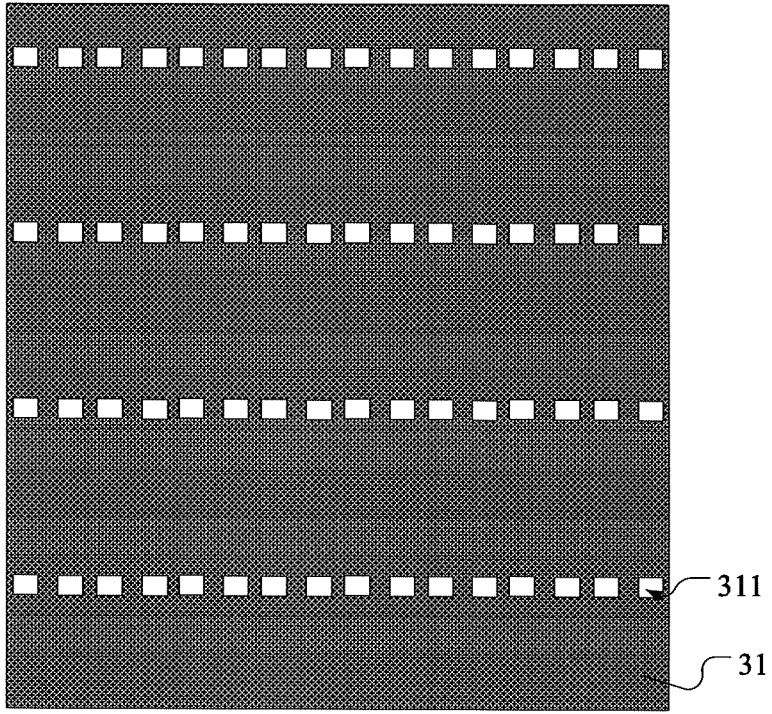
FIG. 3 is a structural diagram of the third conductive layer in FIG. 2.
Figure 4:
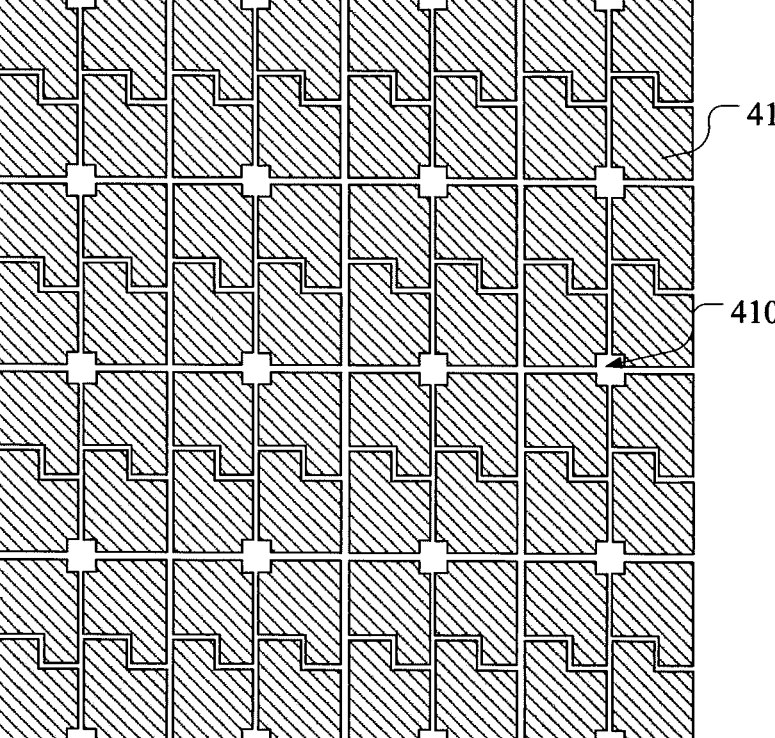
FIG. 4 is a structural diagram of the pixel electrode layer in FIG. 2.
Figure 5:
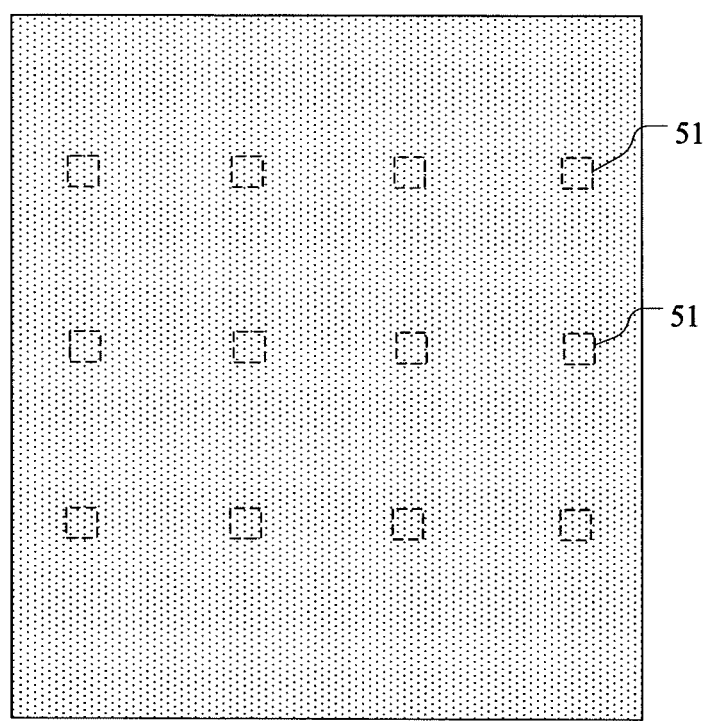
FIG. 5 is a structural diagram of the common electrode layer in FIG. 2.
Figure 6:
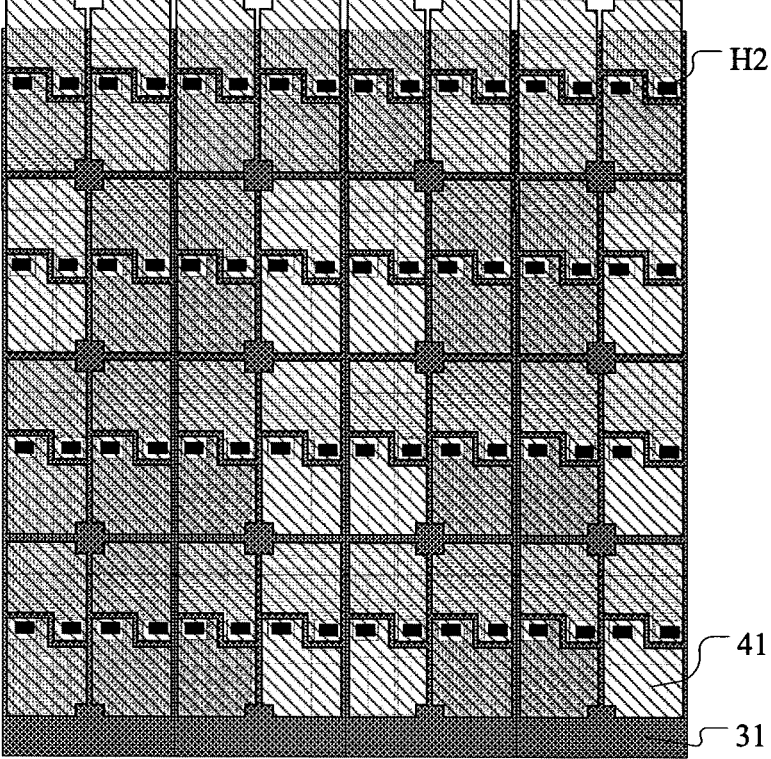
FIG. 6 is a structural diagram of the third conductive layer and the pixel electrode layer in FIG. 2.

Accordingly, the present exemplary embodiment provides a display panel, as shown in FIGS. 2-6, in which FIG. 2 is a structural diagram of an exemplary embodiment of the display panel of the present disclosure, FIG. 3 is a structural diagram of the third conductive layer in FIG. 2, FIG. 4 is a structural diagram of the pixel electrode layer in FIG. 2, FIG. 5 is a structural diagram of the common electrode layer in FIG. 2, and FIG. 6 is a structural diagram of the third conductive layer and the pixel electrode layer in FIG. 2. The display panel may include a display area AA, and the display panel further includes: a base substrate, a third conductive layer, a pixel electrode layer, and a common electrode layer. The third conductive layer may be located on one side of the base substrate, and the third conductive layer may include a first conductive part 31. The first conductive part 31 may be located in the display area AA. The pixel electrode layer may be located on the side of the third conductive layer away from the base substrate. The common electrode layer may be located on the side of the pixel electrode layer away from the base substrate. The common electrode layer may include a plurality of through-hole contacting parts 51 located in the display area, and the through-hole contacting parts 51 may be connected to the first conductive part via the first through hole H1. The through-hole contacting part 51 may be a part of the common electrode layer in contact with the first through hole H1, that is, the orthographic projection of the through-hole contacting part 51 on the base substrate may be overlapped with the orthographic projection of the first through hole H1 on the base substrate.

In this exemplary embodiment, the first conductive part 31 and the common electrode layer may form a parallel structure, thereby reducing the resistance between two different positions on the common electrode layer, thereby reducing display unevenness caused by the intrinsic resistance of the common electrode layer.

In this exemplary embodiment, the display panel may include the pixel driving circuit shown in FIG. 1 and a light emitting unit connected to the pixel driving circuit. It should be understood that in other exemplary embodiments, the pixel driving circuit in the display panel may also have other structures, for example, the pixel driving circuit may have a 7T1C structure, an 8T1C structure, and the like. In addition, in other exemplary embodiments, the common electrode layer may also include a through-hole contacting part 51 located in the display area AA, and the through-hole contacting part 51 may be connected to the first conductive part 31 via the first through hole H1.

As shown in FIGS. 2, 4, and 6, the pixel electrode layer may include a plurality of pixel electrode parts 41, and the pixel electrode parts 41 may be used to form the anode of the light emitting unit. A second opening 410 in the display area AA may be formed between four adjacent pixel electrode parts 41. The orthographic projection of the first through hole H1 on the base substrate may be located within the orthographic projection of the second opening 410 on the base substrate, that is, There is a gap between the edges of the orthographic projection of the first through hole H1 on the base substrate and the edges of the orthographic projection of the second opening 410 on the base substrate, so that the conductor filled in the first through hole H1 may be insulated from the pixel electrode part 41. In this exemplary embodiment, the third conductive layer may be disposed on the side of the layer where the driving transistor is located away from the base substrate. As shown in FIGS. 2 and 3, a plurality of first openings 311 may be disposed on the third conductive layer, and the pixel electrode part 41 may be connected to the first electrode of the driving transistor via the second through hole H2, wherein the orthographic projection of the second through hole H2 on the base substrate may be located within the orthographic projection of the first opening 311 on the base substrate. The common electrode layer may form the cathode of the light emitting unit. It should be understood that, in other exemplary embodiments, the pixel electrode parts on the pixel electrode layer may also be arranged in other ways, and the second openings on the pixel electrode layer may also be located at other positions, for example, in the same pixel unit row, the pixel electrode parts may be sequentially arranged along the row direction, and the second opening may be located at any position of the pixel electrode layer. In this exemplary embodiment, as shown in FIGS. 2, 3 and 6, the first conductive part 31 may cover all areas of the display area AA except the area where the first opening 311 is located. It should be understood that, in other exemplary embodiments, the first conductive part 31 may also be provided with other hollow openings. In addition, the first conductive part 31 may also be in other shapes such as a linear shape.

Figure 7:
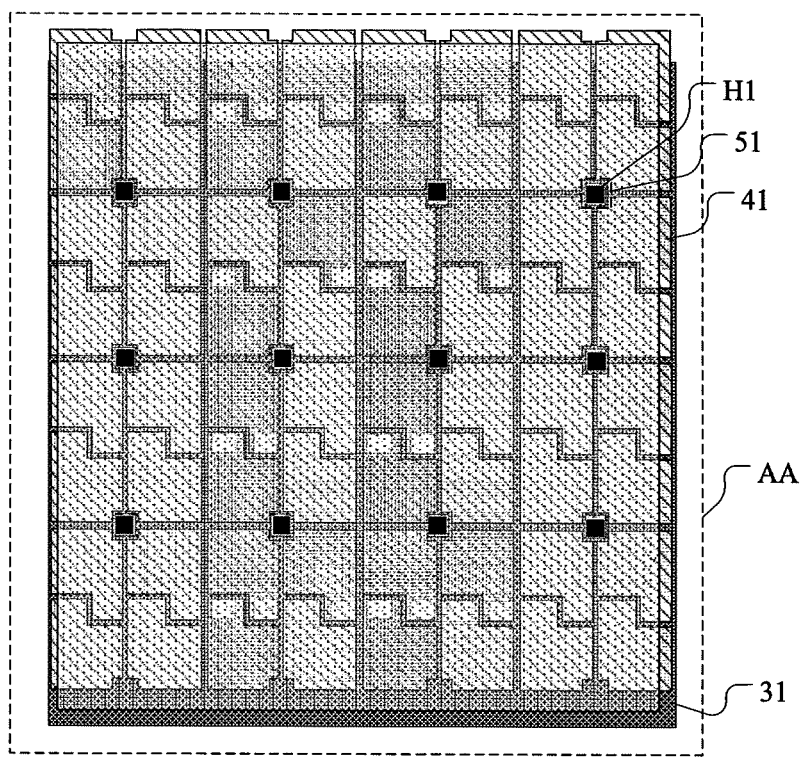
FIG. 7 is a structural diagram of another exemplary embodiment of the display panel of the present disclosure.
Figure 8:
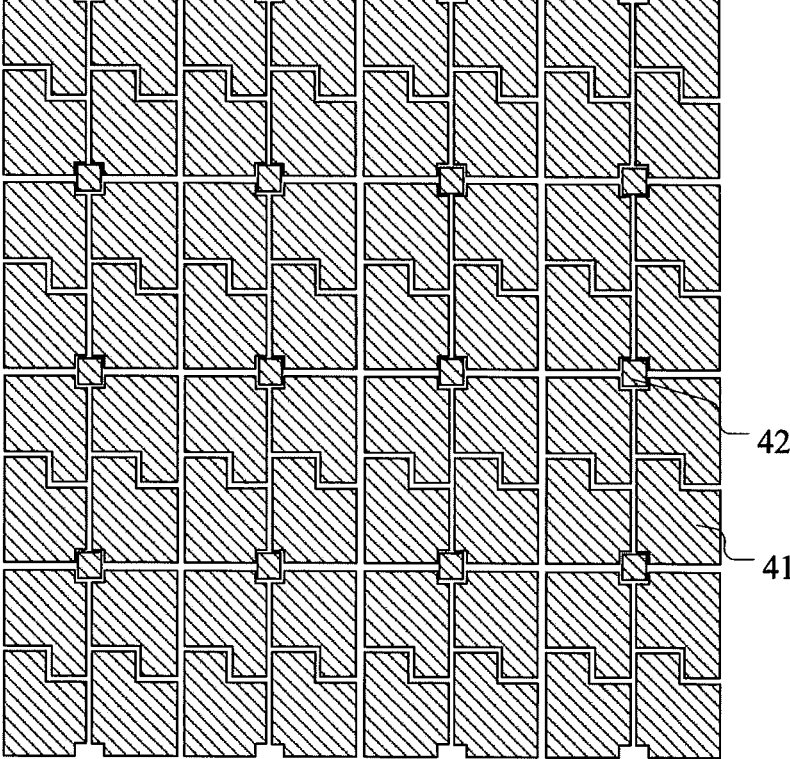
FIG. 8 is a structural diagram of the pixel electrode layer in FIG. 7.
Figure 9:
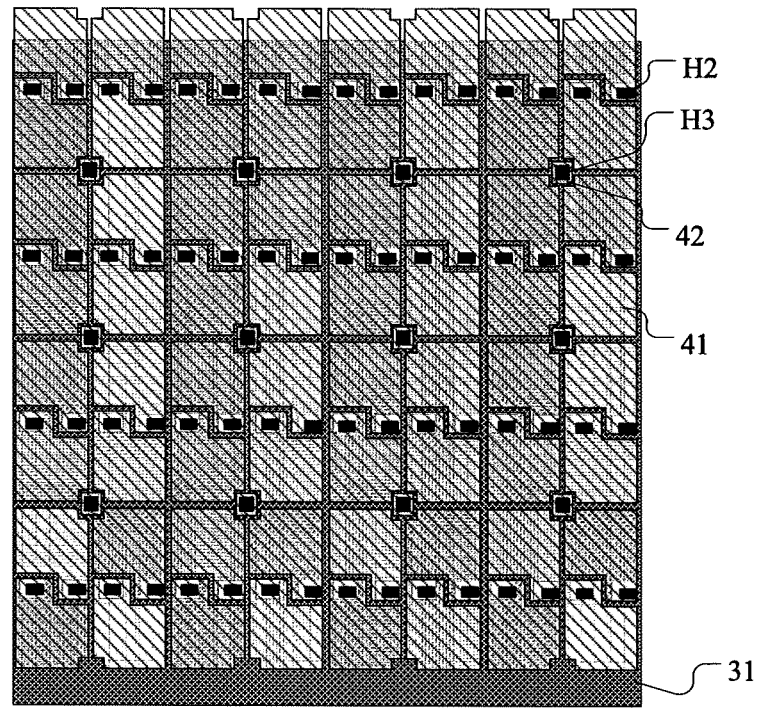
FIG. 9 is a structural diagram of the third conductive layer and the pixel electrode layer in FIG. 7.

As shown in FIGS. 7-9, FIG. 7 is a structural diagram of another exemplary embodiment of the display panel of the present disclosure, FIG. 8 is a structural diagram of the pixel electrode layer in FIG. 7, and FIG. 9 is the structural diagram of the third conductive layer and the pixel electrode layer. Different from the display panel shown in FIG. 2, the pixel electrode layer in the display panel shown in FIG. 7 may further include a transiting part 42, and the orthographic projection of the transiting part 42 on the base substrate may be located within the orthographic projection of the second opening 410 on the base substrate, and there is a gap between the transiting part 42 and the pixel electrode part 41. The transiting part 42 may be connected to the first conductive part 31 via the third through hole H3. The through-hole contacting part 51 may be connected to the transiting part 42 via the first through hole H1, to connect the first conductive part 31. In this exemplary embodiment, the through-hole contacting part 51 and the first conductive part 31 are connected by the transiting part 42, thereby improving the connection effect between the through-hole contacting part 51 and the first conductive part 31. In addition, other structures of the display panel shown in FIG. 7 may be the same as the corresponding structures of the display panel shown in FIG. 2. In this exemplary embodiment, as shown in FIGS. 6, 7 and 9, the orthographic projection of the first through hole H1 on the base substrate and the orthographic projection of the third through hole H3 on the base substrate may both be squares. The square through hole has a better connection effect and may increase the lifespan of the display panel.

In the following exemplary embodiment, each layered structure of the display panel will be described in detail.

The display panel may further include a light shielding layer, an active layer, a first conductive layer, and a second conductive layer, wherein the base substrate, the light shielding layer, the active layer, the first conductive layer, the second conductive layer, the third conductive layer, the pixel electrode layer and the common electrode layer may be stacked in sequence, and an insulating layer may be provided between the above-mentioned structural layers.

Figure 10:
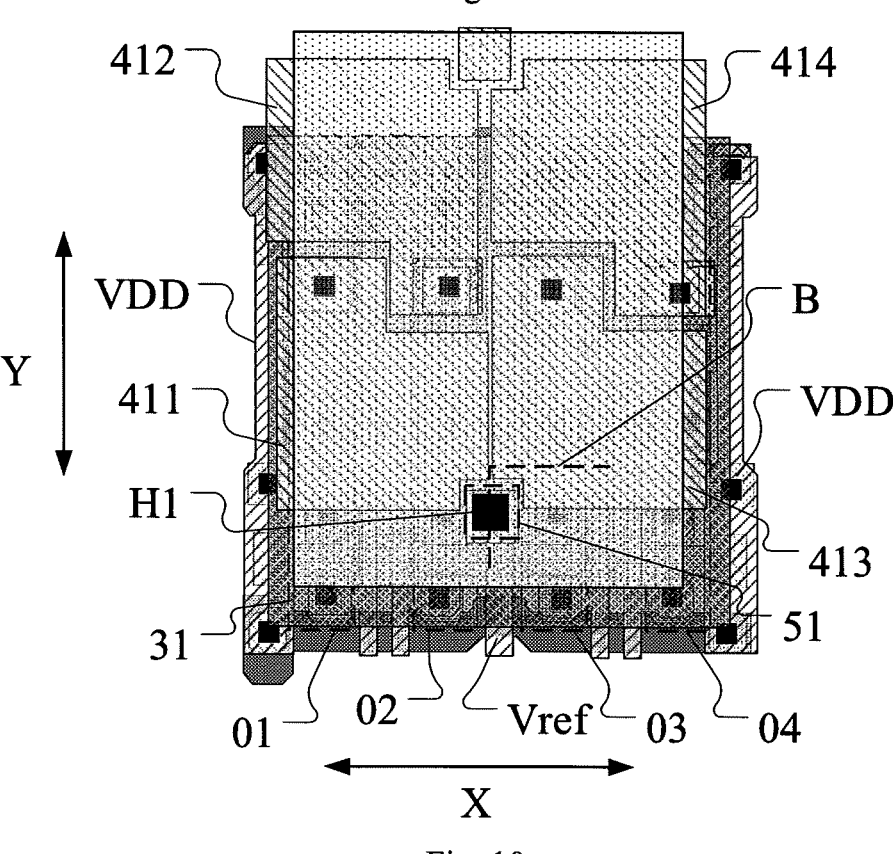
FIG. 10 is a structural diagram of an exemplary embodiment of the display panel of the present disclosure.
Figures 11, 12:
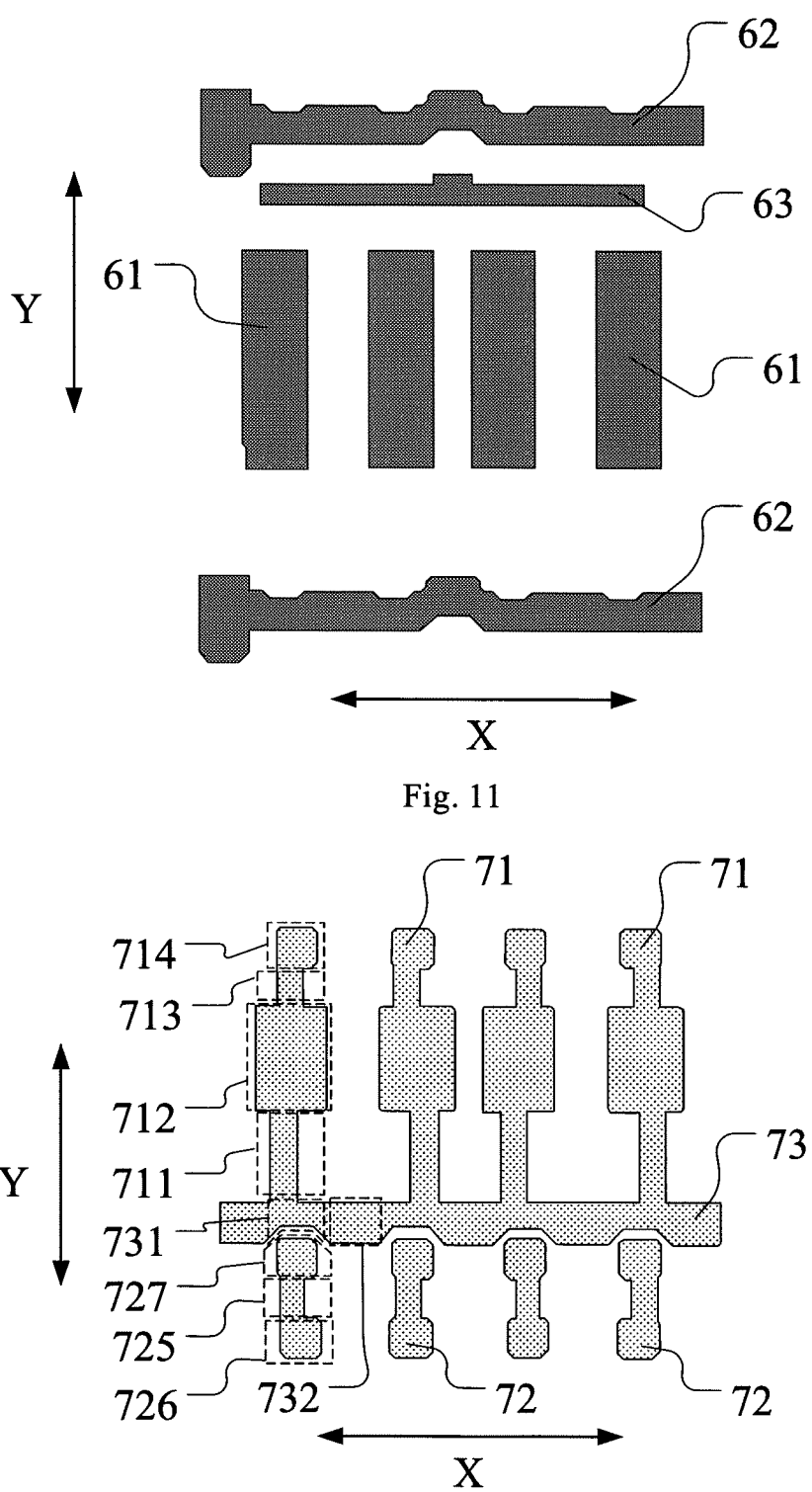
FIG. 11 is a structural diagram of the light shielding layer in FIG. 10.
FIG. 12 is a structural diagram of the active layer in FIG. 10.
Figures 13, 14:
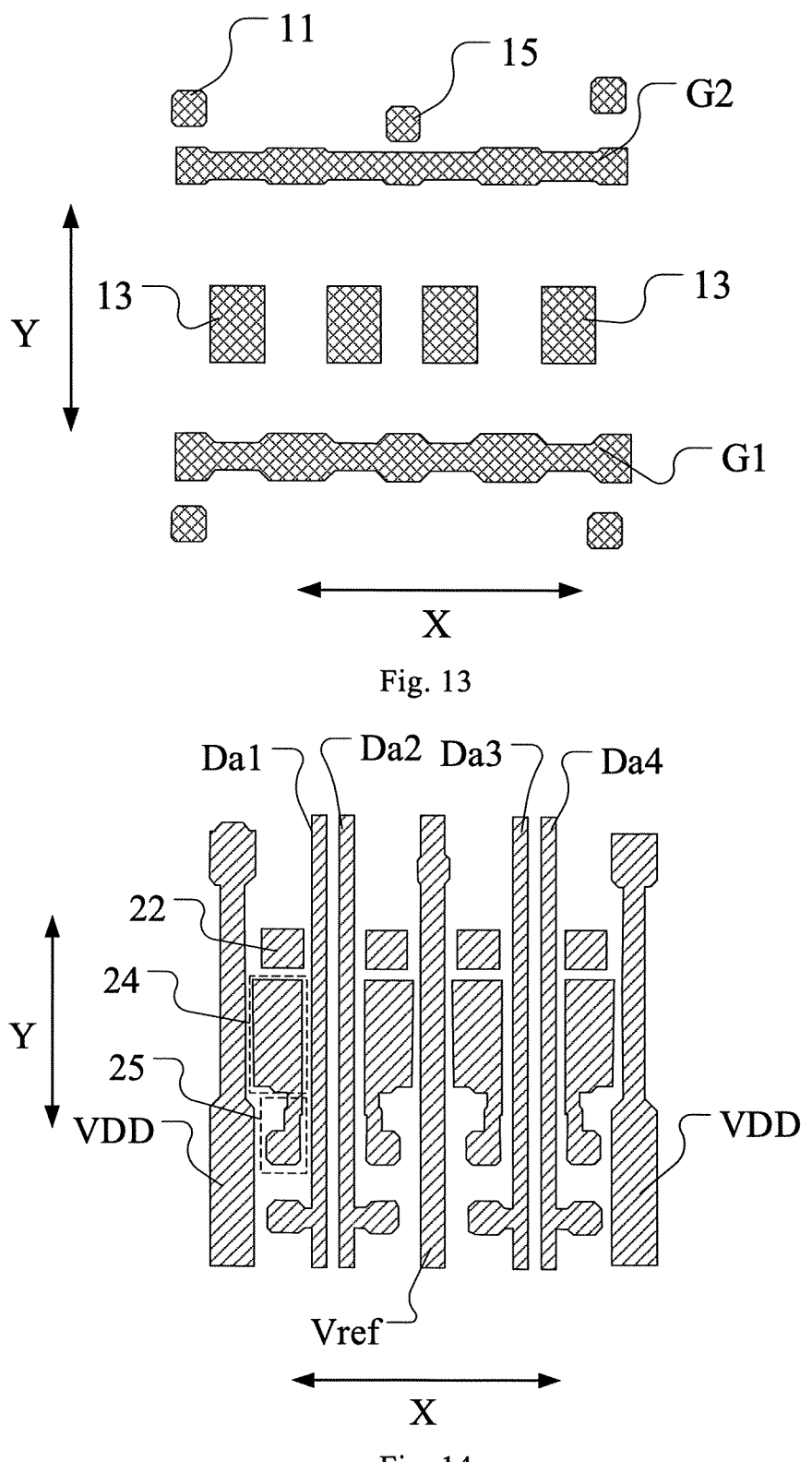
FIG. 13 is a structural diagram of the first conductive layer in FIG. 10.
FIG. 14 is a structural diagram of the second conductive layer in FIG. 10.
Figure 15:
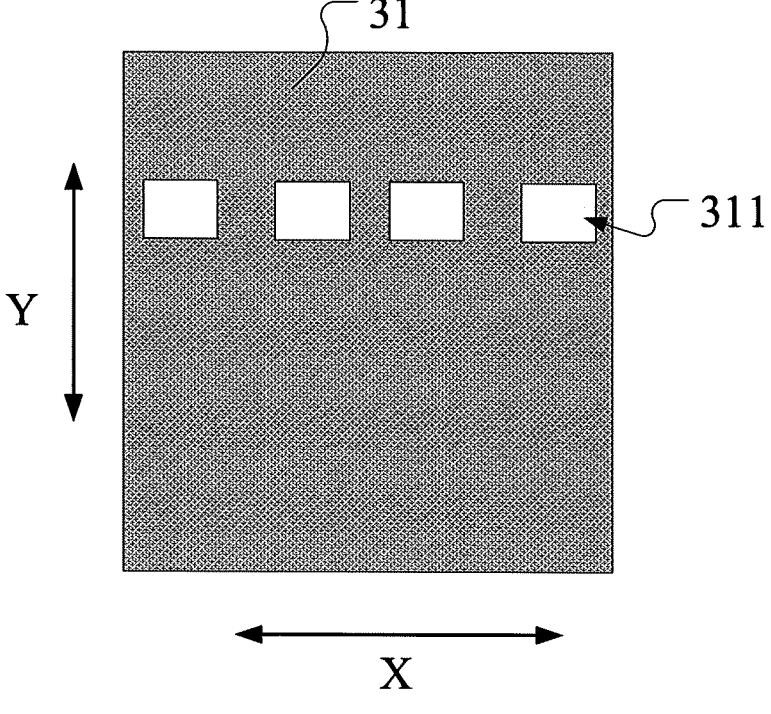
FIG. 15 is a structural diagram of the third conductive layer in FIG. 10.
Figure 16:
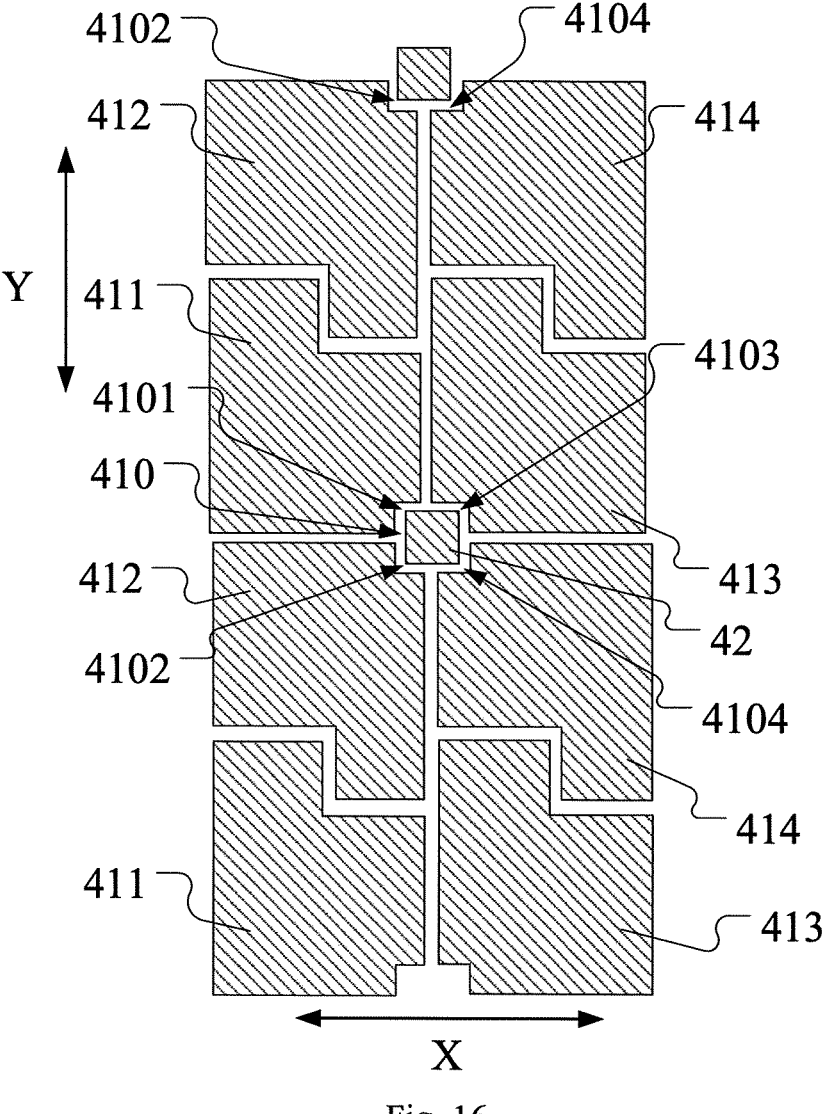
FIG. 16 is a structural diagram of the pixel electrode layer in FIG. 10.
Figures 17, 18:
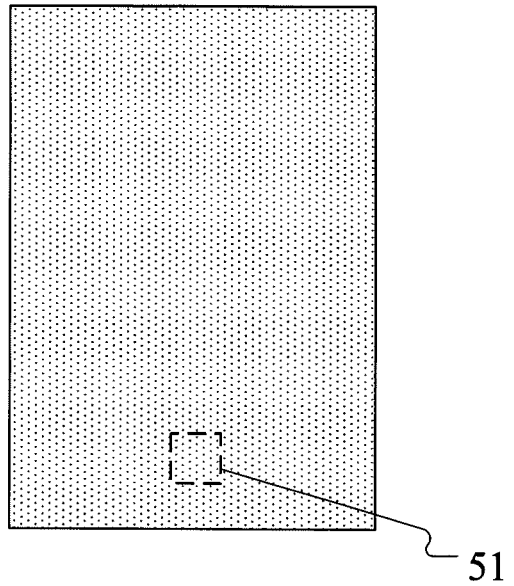
FIG. 17 is a structural diagram of the common electrode layer in FIG. 10.
FIG. 18 is a structural diagram of the light shielding layer and the active layer in FIG. 10.
Figure 19:
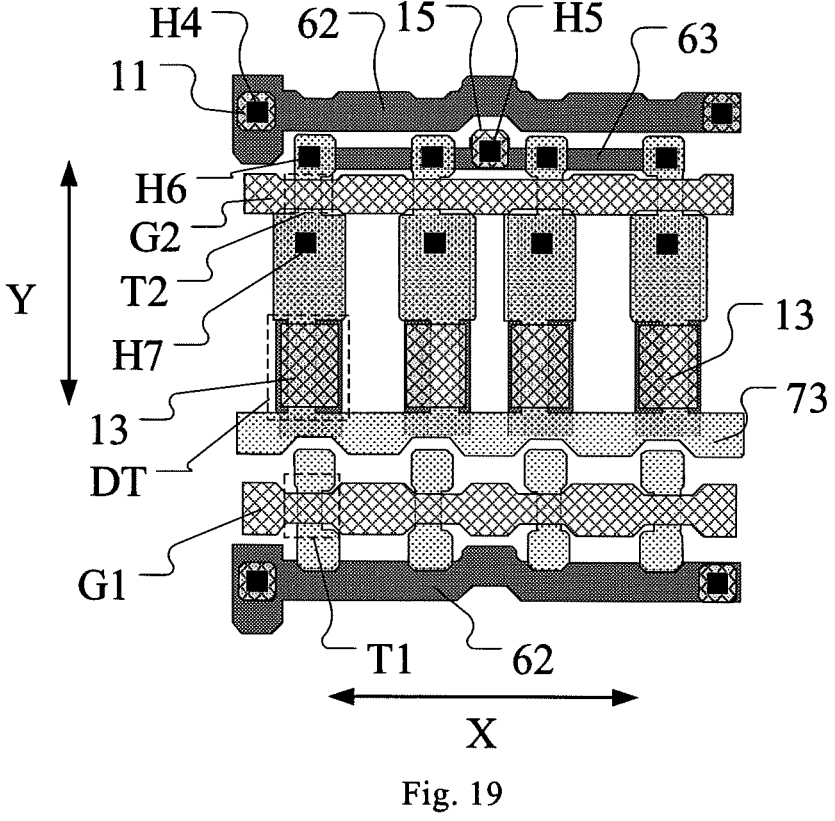
FIG. 19 is a structural diagram of the light shielding layer, the active layer and the first conductive layer in FIG. 10.
Figure 20:
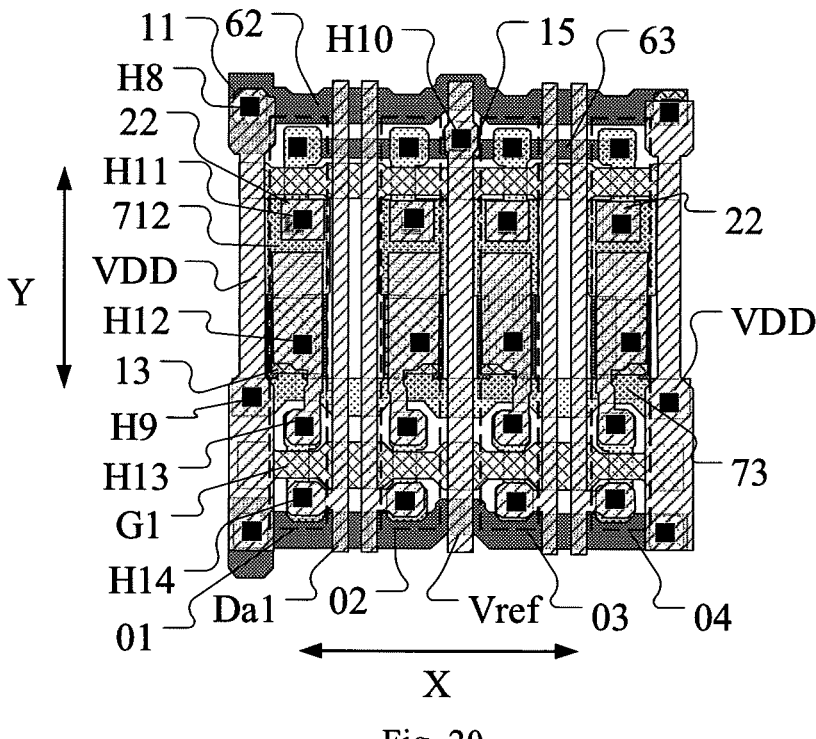
FIG. 20 is a structural diagram of the light shielding layer, the active layer, the first conductive layer and the second conductive layer in FIG. 10.
Figures 21, 22:
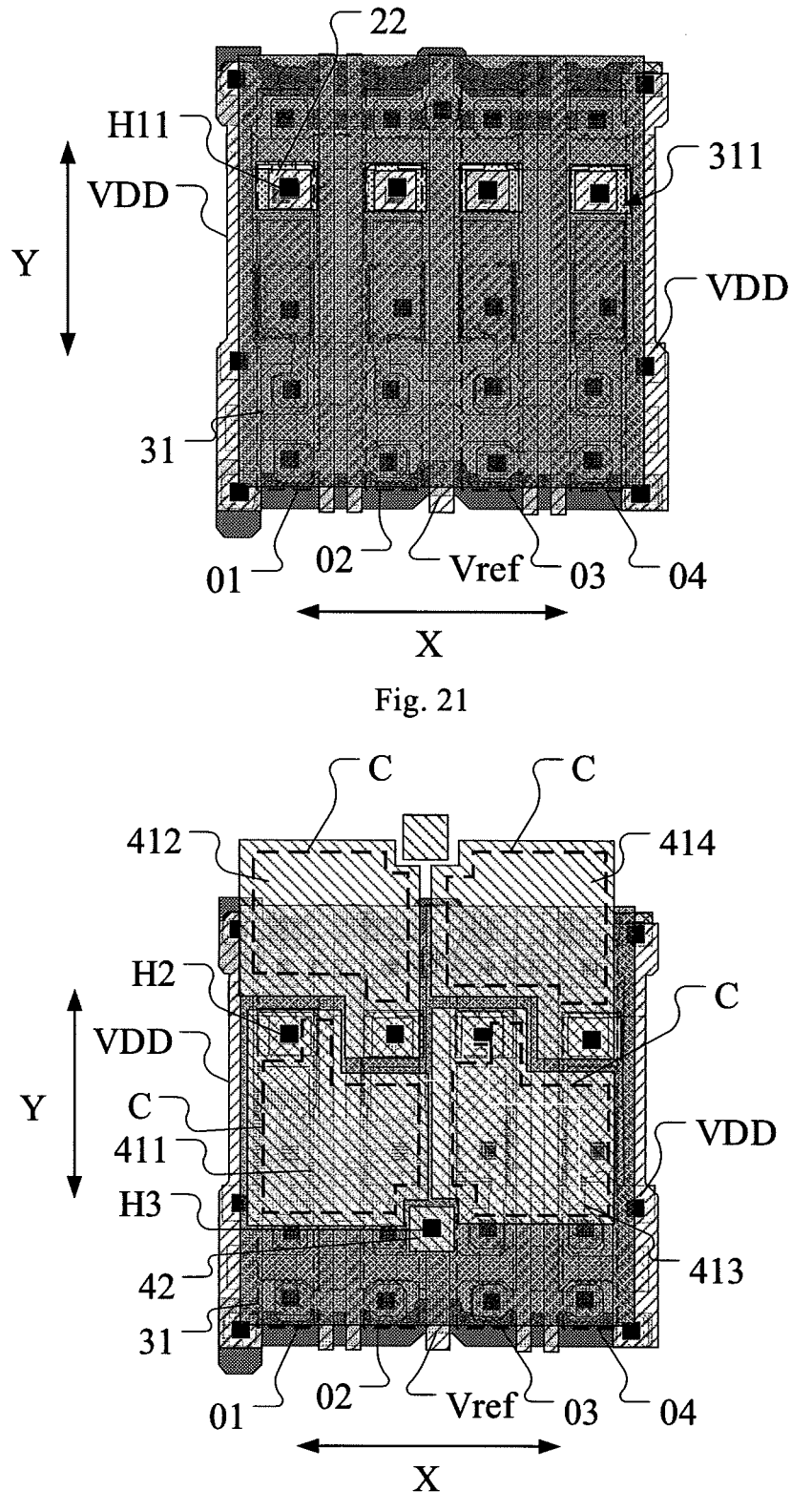
FIG. 21 is a structural diagram of the light shielding layer, the active layer, the first conductive layer, the second conductive layer and the third conductive layer in FIG. 10.
FIG. 22 is a structural diagram of the light shielding layer, the active layer, the first conductive layer, the second conductive layer, the third conductive layer and the pixel electrode layer in FIG. 10.

As shown in FIGS. 10-22, FIG. 10 is a structural diagram of an exemplary embodiment of a display panel of the present disclosure, FIG. 11 is a structural diagram of the light shielding layer in FIG. 10; FIG. 12 is a structural diagram of the active layer in FIG. 10; FIG. 13 is a structural diagram of the first conductive layer in FIG. 10; FIG. 14 is a structural diagram of the second conductive layer in FIG. 10; FIG. 15 is a structural diagram of the third conductive layer in FIG. 10; FIG. 16 is a structural diagram of the pixel electrode layer in FIG. 10; FIG. 17 is a structural diagram of the common electrode layer in FIG. 10; FIG. 18 is a structural diagram of the light shielding layer and the active layer in FIG. 10; FIG. 19 is a structural diagram of the light shielding layer, the active layer and the first conductive layer in FIG. 10; FIG. 20 is a structural diagram of the light shielding layer, the active layer, the first conductive layer and the second conductive layer in FIG. 10; FIG. 21 is a structural diagram of the light shielding layer, the active layer, the first conductive layer, the second conductive layer and the third conductive layer in FIG. 10; FIG. 22 is a structural diagram of the light shielding layer, the active layer, the first conductive layer, the second conductive layer, the third conductive layer and the pixel electrode layer in FIG. 10.

As shown in FIGS. 10, 11 and 18, the light shielding layer may be a conductive layer, for example, the light shielding layer may be a light shielding metal layer. The light shielding layer may include a first light shielding part 61, a first connecting line 62, and a second connecting segment 63. The orthographic projection of the first connecting line 62 on the base substrate and the orthographic projection of the second connecting segment 63 on the base substrate may extend along the first direction X, and the first direction X may be the row direction of the display panel. The display panel may include a plurality of pixel units arranged in an array, and each pixel unit may include four pixel driving circuits arranged in the first direction X. FIGS. 10-22 show structural diagrams of four pixel driving circuits in one pixel unit. Each pixel unit may be provided with a corresponding second connecting segment 63, and each row of pixel units may be provided with a corresponding first connection line 62. It should be understood that, in other exemplary embodiments, each pixel unit may also include other numbers of pixel driving circuits arranged in the first direction. For example, each pixel unit may include three pixel driving circuits arranged in the first direction, two driving circuits arranged in the first direction, etc.

As shown in FIGS. 10, 12 and 18, the active layer may include a first active part 71, a second active part 72, and an active line 73. The first active part 71 may include a first sub active part 711, a second sub active part 712, a third sub active part 713, and a fourth sub active part 714. The first sub active part 711, the second sub active part 712, the third sub active part 713 and the fourth sub active part 714 may be connected in sequence in the second direction Y. The second direction Y may intersect with the first direction X, and the second direction may be the column direction of the display panel. The second active part 72 may include a fifth sub active part 725, a sixth sub active part 726, and a seventh sub active part 727. The first sub active part 711 may be used to form the channel region of the driving transistor DT; the third sub active part 713 may be used to form the channel region of the second transistor T2; and the fifth sub active part 725 may be used to form the channel region of the first transistor T1. The active line 73 may be connected to a plurality of first sub active parts 711 arranged in the first direction X, and the active line 73 may be connected to a side of the first sub active part 711 away from the second sub active part 712. The four fourth sub active parts 714 located in the same pixel unit may be connected to the second connecting segment 63 via the through holes H6, respectively. The second sub active part 712 may be connected to the first light shielding part 61 via the through hole H7. The active layer may be formed of an oxide semiconductor material, for example, the active layer may be formed of an indium gallium zinc oxide material. The orthographic projection of the first light shielding part 61 on the base substrate may cover the orthographic projection of the first sub active part 711 on the base substrate, and the first light shielding part 61 may shield the first sub active part 711 from light to prevent the characteristics of the driving transistor DT from changing under illumination.

As shown in FIGS. 10, 13 and 19, the first conductive layer may include a first gate line G1, a second gate line G2, a third conductive part 13, a fifth conductive part 15, and a conductive part 11. The orthographic projection of the first gate line G1 on the base substrate may extend along the first direction X, a partial structure of the first gate line G1 may be used to form the gate electrode of the first transistor, and the first gate line G1 may provide the first control terminal G1 in FIG. 1. The orthographic projection of the second gate line G2 on the base substrate may extend along the first direction X, a partial structure of the second gate line may be used to form the gate electrode of the second transistor, and the second gate line G2 may provide the second control terminal G2 in FIG. 1. The orthographic projection of the third conductive part 13 on the base substrate may cover the first sub active part 711, and the third conductive part 13 may be used to form the gate electrode of the driving transistor DT. The orthographic projection of the fifth conductive part 15 on the base substrate may at least partially overlap with the orthographic projection of the second connecting segment 63 on the base substrate, and the fifth conductive part 15 may be connected to the second connecting segment 63 via the through hole H5. The conductive part 11 may be connected to the first connection line 62 via the through hole H4. During the manufacturing process of the display panel, the active layer may be conductively processed by using the first conductive layer as a mask, that is, the active layer covered by the first conductive layer forms the channel region of the transistor, while the active layer not covered by the first conductive layer forms the conductor structure.

As shown in FIGS. 10, 14, and 20, in FIG. 20, each pixel unit in the display panel may include a first pixel driving circuit 01, a second pixel driving circuit 02, a third pixel driving circuit and a fourth pixel driving circuit 04 that are sequentially arranged in the first direction. The second conductive layer may include a first data line Da1, a second data line Da2, a third data line Da3, a fourth data line Da4, a power supply line VDD, a reference signal line Vref, a second conductive part 22, a fourth conductive part 24, and a bridging part 25. The first data line Da1 may be used to provide a data signal terminal to the first pixel driving circuit 01; the second data line Da2 may be used to provide a data signal terminal to the second pixel driving circuit 02; the third data line Da3 may be used to provide a data signal terminal to the third pixel driving circuit 03; and the fourth data line Da4 may be used to provide a data signal terminal to the fourth pixel driving circuit 04. The orthographic projection of the first data line Da1 on the base substrate, orthographic projection of the second data line Da2 on the base substrate, the orthographic projection of the third data line Da3 on the base substrate, the orthographic projection of the fourth data line Da4 on the base substrate, the orthographic projection of the power supply line VDD on base substrate and the orthographic projection of the reference signal line Vref on the base substrate may all extend along the second direction Y. The power supply line VDD may be used to provide the first power supply signal terminal in FIG. 1, and the reference signal line Vref may be used to provide the reference signal terminal in FIG. 1. As shown in FIG. 20, the power supply line VDD may be connected to the active line 73 via the through hole H9 to connect the second electrode of the driving transistor DT and the first power supply terminal. The second conductive part 22 may be connected to the second sub active part 712 via the through hole H11. The fourth conductive part 24 may be connected to the third conductive part 13 via the through hole H12, the fourth conductive part 24 may be used to form the second electrode of the capacitor C, and the orthographic projection of the fourth conductive part 24 on the base substrate may be at least partly overlapped with the orthographic projection of the second sub active part 712 on the base substrate, and the second sub active part 712 may be used to form the first electrode of the capacitor C. The orthographic projection of the fourth conductive part 24 on the base substrate may also at least partially overlap with the orthographic projection of the first light shielding part 61 on the base substrate. Since the second sub active part 712 is connected to the first light shielding part 61 via the through hole H7, a partial structure of the first light shielding part 61 may also form the first electrode of the capacitor C. It should be understood that, in other exemplary embodiments, the display panel may also add other light shielding metal layers between the light shielding layer and the active layer, and the added light shielding metal layer may be connected with the fourth conductive part 24 via a through hole to form the second electrode of capacitor C. The bridging part 25 may be connected to the fourth conductive part 24 and the seventh sub active part 727 via the through hole H13 to connect the first electrode of the first transistor and the gate electrode of the driving transistor. The first data line Da1 may be connected to the sixth sub active part 726 via the through hole H14 to connect the data signal terminal and the second electrode of the first transistor. The reference signal line Vref may be connected to the fifth conductive part 15 via the through hole H10 to connect the initial signal terminal and the first electrodes of the plurality of second transistors in the same pixel unit. As shown in FIG. 20, a power supply line VDD may be provided corresponding to each column of pixel units, the power supply line VDD may be located between adjacent columns of pixel units, and each power supply line VDD may be connected to the same first connection line 62 via a through hole, so that the power supply line VDD forms a grid structure, and the grid structure may reduce the difference of voltages on the power supply lines at different positions of the display panel.

As shown in FIG. 20, the orthographic projection of the first data line Da1 on the base substrate may be located between the orthographic projection of the first pixel driving circuit 01 on the base substrate and the orthographic projection of the second pixel driving circuit 02 on the base substrate. The orthographic projection of the second data line Da2 on the base substrate is located between the orthographic projection of the first pixel driving circuit 01 on the base substrate and the orthographic projection of the second pixel driving circuit 02 on the base substrate. The orthographic projection of the third data line Da3 on the base substrate may be located between the orthographic projection of the third pixel driving circuit 03 on the base substrate and the orthographic projection of the fourth pixel driving circuit 04 on the base substrate. The orthographic projection of the fourth data line Da4 on the base substrate may be located between the orthographic projection of the third pixel driving circuit 03 on the base substrate and the orthographic projection of the fourth pixel driving circuit 04 on the base substrate. The orthographic projection of the reference signal line Vref on the base substrate may be located between the orthographic projection of the second pixel driving circuit 02 on the base substrate and the orthographic projection of the third pixel driving circuit 03 on the base substrate.

As shown in FIGS. 10, 15 and 21, the third conductive layer may include a first conductive part 31, and the first conductive part may be provided with a first opening 311 corresponding to the second conductive part 22 one-to-one. The orthographic projection of the first opening 311 on the base substrate may at least partially overlap with the orthographic projection of the second conductive part 22 on the base substrate.

As shown in FIGS. 10, 16 and 22, the pixel electrode layer may include a plurality of pixel electrode parts, and the plurality of pixel electrode parts may be respectively used to form anodes of the light emitting units. FIG. 16 shows pixel electrode parts of two pixel units adjacent in the second direction Y. In the same pixel unit, the plurality of pixel electrode parts may include a first pixel electrode part 411, a second pixel electrode part 412, a third pixel electrode part 413, and a fourth pixel electrode part 414. The first pixel driving circuit 01 is connected to the first pixel electrode part 411, the second pixel driving circuit 02 is connected to the second pixel electrode part 412, the third pixel driving circuit 03 is connected to the third pixel The electrode part 413, and the fourth pixel driving circuit 04 is connected to the fourth pixel electrode part 414. In the same pixel unit, the first pixel electrode part 411, the second pixel electrode part 412, the third pixel electrode part 413, and the fourth pixel electrode part 414 may be arranged in a two-by-two matrix. As shown in FIG. 22, the dotted box C may represent the shape of the orthographic projection on the base substrate of the pixel openings in the pixel definition layer in the display panel. Arranging the pixel electrode parts in a two-by-two matrix structure can not only greatly increase the aperture ratio of the display panel, but also increase the pixel density of the display panel. When the minimum spacing between adjacent signal lines in the patterning process can reach 2 um, the pixel density of the display panel in this exemplary embodiment can reach 400 PPI. As shown in FIG. 22, the first pixel electrode part 411 may be connected to the second conductive part 22 via the second through hole H2, and the orthographic projection of the second through hole H2 on the base substrate is located within the orthographic projection of the first opening 311 on the base substrate, so as to make sure that the conductor structure in the second through hole H2 is insulated from the first conductive part 31. Similarly, other pixel electrode parts may also be connected to their corresponding second conductive parts via through holes. The display panel may be a top emission display panel, the pixel electrode layer may be reflective, and the pixel electrode layer may be formed by laminating an indium tin oxide layer and a silver layer.

As shown in FIGS. 10, 16 and 22, in the same pixel unit: the first pixel electrode part 411 and the third pixel electrode part 413 are arranged adjacent to each other in the first direction X, and the first pixel electrode part 411 and the second pixel electrode part 412 are arranged adjacent to each other in the second direction Y. A first notch 4101 is formed at the corner of the first pixel electrode part 411 facing the third pixel electrode part 413 and away from the second pixel electrode part 412; a second notch 4102 is formed at the corner of the second pixel electrode part 412 facing the fourth pixel electrode part 414 and away from the first pixel electrode part 411; a third notch 4103 is formed at the corner of the third pixel electrode part 413 facing the first pixel electrode part 411 and away from the fourth pixel electrode part 414; and a fourth notch 4104 is formed at the corner of the fourth pixel electrode part 414 facing the second pixel electrode part 412 and away from the third pixel electrode part 413. In two pixel units adjacent to each other in the column direction, the first notch and the third notch in one pixel unit and the second notch and the fourth notch in the other pixel unit are arranged adjacent to each other, and the adjacent first notch, third notch, second notch, and fourth notch may be used to form the second opening 410. The orthographic projection of the first notch 4101 on the base substrate, the orthographic projection of the second notch 4102 on the base substrate, the orthographic projection of the third notch 4103 on the base substrate, and the orthographic projection of the fourth notch 4104 on the base substrate may have the same shape and area, so that the orthographic projection of the first pixel electrode part 411 on the base substrate, the orthographic projection of the second pixel electrode part 412 on the base substrate, the orthographic projection of the third pixel electrode part 413 on the base substrate, and the orthographic projection of the fourth pixel electrode part 414 on the base substrate may have the same area. The pixel electrode layer may further include a transiting part 42. The transiting part 42 may be located within the second opening 410 and be insulated from other pixel electrode parts. The transiting part 42 may be connected to the first conductive part 31 via the third through hole H3.

As shown in FIGS. 10 and 17, the common electrode layer may include a through-hole contacting part 51, and the through-hole contacting part 51 may be connected to the transiting part 42 via the first through hole H1 to connect the first conductive part 31. In the display panel provided by this exemplary embodiment, each of the pixel units may be provided with one of the through-hole contacting part 51 correspondingly.

In this exemplary embodiment, as shown in FIGS. 14 and 20, the orthographic projection of the second active part 72 on the base substrate is located at a side of the orthographic projection of the active line 73 away from the fourth conductive part 24, so the orthographic projection of the bridging part 25 on the base substrate must intersect with the orthographic projection of the active line 73 on the base substrate. In this exemplary embodiment, as shown in FIG. 14, the size of the orthographic projection of the bridging part on the base substrate in the first direction X is smaller than the orthographic projection of the fourth conductive part 24 on the base substrate in the first direction X. This arrangement can reduce the overlapping area of the active line 73 and the bridging part 25, thereby reducing the parasitic capacitance of the bridging part 25, thereby accelerating the speed of writing data signals to the driving transistor gate electrode by the data line.

In this exemplary embodiment, as shown in FIGS. 12 and 20, the active line 73 may include a first active line 731 and a second active line 732 alternately connected in the first direction X. The size of the orthographic projection of the first active line 731 on the base substrate in the second direction Y may be smaller than the size of the orthographic projection of the second active line 732 on the base substrate in the second direction Y. The orthographic projection of the first active line 731 on the base substrate intersects with the orthographic projection of the bridging part 25 on the base substrate, and the orthographic projection of the second active line 732 on the base substrate may not intersect with the orthographic projection of the bridging part 25 on the base substrate. This arrangement can further reduce the parasitic capacitance of the bridging part 25, thereby speeding up the speed of writing data signals to the driving transistor gate electrode by the data lines. The first active line 731 may be formed by notching the active line 73 on the side facing the second active part 72. The orthographic projection of the first active line 731 on the base substrate may be opposite to the orthographic projection of the second active part 72 on the base substrate in the second direction Y, that is, the area covered by moving the orthographic projection of the first active line 731 on the base substrate in the second direction Y may cover the orthographic projection of the second active part 72 on the base substrate. This arrangement can also increase the distance between the orthographic projection of the first active line 731 on the base substrate and the orthographic projection of the second active part 72 on the base substrate in the second direction, thereby reducing the etching difficulty of the active layer.

Figure 23:
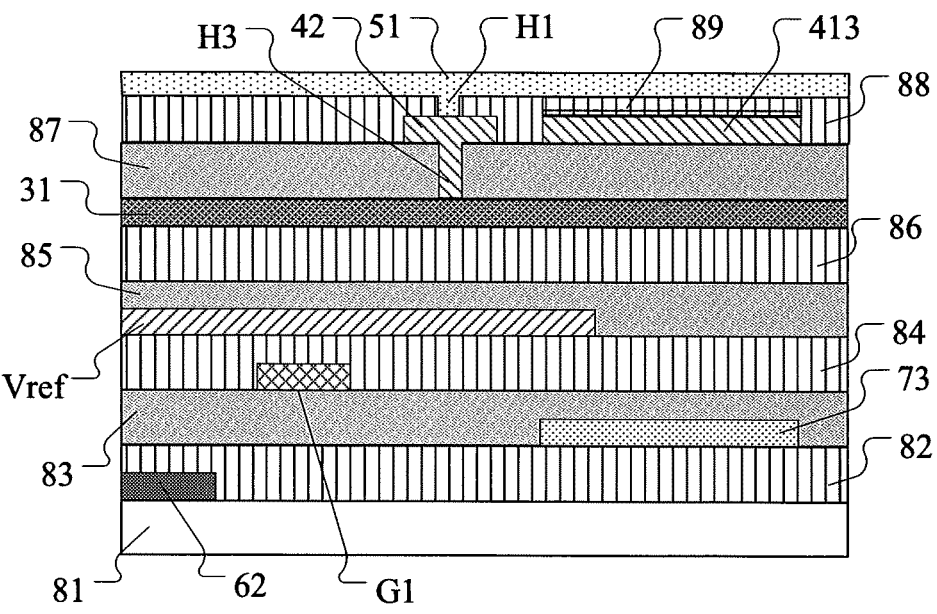
FIG. 23 is a partial sectional view along the dashed line B in FIG. 10.

As shown in FIG. 23, it is a partial cross-sectional view taken along the dotted line B in FIG. 10. The display panel may further include: a buffer layer 82, a gate insulating layer 83, a first dielectric layer 84, a first passivation layer 85, a planarization layer 86, a second passivation layer 87, a pixel defining layer 88, and a light emitting unit 89. The base substrate 81, the light shielding layer, the buffer layer 82, the active layer, the gate insulating layer 83, the first conductive layer, the first dielectric layer 84, the second conductive layer, the first passivation layer 85, the planarization layer 86, the first conductive layer, the second conductive layer, the third conductive layer, the second passivation layer 87, the pixel electrode layer, the pixel defining layer 88, the light emitting unit 89, and the common electrode layer are stacked in sequence. The buffer layer 82 may include at least one of a silicon oxide layer and a silicon nitride layer. The gate insulating layer 83 may be a silicon oxide layer. The first dielectric layer 84 may be a silicon nitride layer. The first passivation layer 85 and the second passivation layer 87 may be a silicon nitride layer or a silicon oxide layer. The material of the flat layer 86 may be an organic material, such as polyimide (PI), polyethylene terephthalate (PET), polyethylene naphthalate (PEN), silicon-glass bonding structure (SOG), and the like. The material of the pixel defining layer 88 may be a photolithography material. The light emitting unit 89 may include a hole injection layer, a hole transport layer, an organic light-emitting layer, an electron transport layer, and an electron injection layer stacked in sequence. The material of the second conductive layer and the third conductive layer may include metal materials, such as one or an alloy of molybdenum, aluminum, copper, titanium, niobium, or molybdenum/titanium alloy or laminate, or titanium/titanium Aluminum/titanium laminate. The material of the first conductive layer may be one or an alloy of molybdenum, aluminum, copper, titanium, niobium, or a molybdenum/titanium alloy or a laminate or the like. In addition, the display panel may further include a glass cover plate on the side of the common electrode layer away from the base substrate, and a black matrix (BM) layer may be disposed on the glass cover plate.

The present exemplary embodiment also provides a display device, which includes the above-mentioned display panel. The display device may be a display device such as a mobile phone, a tablet computer, a TV, and the like.

Other embodiments of the present disclosure will be readily conceivable to those skilled in the art upon consideration of the specification and practice of what is disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, with the true scope and spirit of the disclosure being indicated by the claims.

It is to be understood that the present disclosure is not limited to the precise structures described above and illustrated in the accompanying drawings, and that various modifications and changes may be made without departing from the scope thereof. The scope of the present disclosure is limited only by the appended claims.

What is claimed is:

1. A display panel comprising a display area, wherein the display panel further comprises:
a base substrate;

a third conductive layer, disposed at a side of the base substrate and comprising a first conductive part positioned in the display area;
a pixel electrode layer, disposed at a side of the third conductive layer away from the base substrate; and
a common electrode layer, disposed at a side of the pixel electrode layer away from the base substrate, wherein the common electrode layer comprises at least one through-hole contacting part in the display area, and the through-hole contacting part is connected to the first conductive part via a first through hole,
wherein the display panel further comprises a pixel driving circuit, wherein the pixel driving circuit comprises a driving transistor, and a first electrode of the driving electrode is connected to a first electrode of a light emitting unit,
the pixel electrode layer comprises a pixel electrode part configured to form the first electrode of the light emitting unit,
wherein the display panel further comprises:
a second conductive layer, disposed between the base substrate and the third conductive layer, wherein the second conductive layer comprises a second conductive part connected to the first electrode of the driving transistor,
wherein a first opening is formed on the first conductive part, and an orthographic projection of the first opening on the base substrate is at least partly overlapped with an orthographic projection of the second conductive part on the base substrate, the pixel electrode part is connected to the second conductive part via a second through hole, and an orthographic projection of the second through hole on the base substrate is positioned within the orthographic projection of the first opening on the base substrate.

2. The display panel according to claim 1, wherein the display panel comprises a plurality of pixel units, the common electrode layer comprises a plurality of through-hole contacting parts, and each pixel unit is correspondingly disposed with one of the through-hole contacting part.

3. The display panel according to claim 2, wherein the pixel electrode layer is provided with a plurality of second openings, and the plurality of second openings are arranged in a one-to-one correspondence with the plurality of through-hole contacting parts, and an orthographic projection of the first through hole on the base substrate is located within the orthographic projection of a second opening corresponding to the first through hole on the base substrate,
wherein the second opening corresponding to the through-hole contacting part is disposed corresponding to the first through hole connected to the through-hole contacting part.

4. The display panel according to claim 3, wherein each pixel unit comprises a plurality of pixel driving circuits, and the plurality of pixel driving circuit comprises a first pixel driving circuit, a second pixel driving circuit, a third pixel driving circuit, and a fourth pixel driving circuit sequentially arranged in a first direction;
each pixel unit comprises a plurality of pixel electrode parts, and the plurality of pixel electrode parts comprises a first pixel electrode part, a second pixel electrode part, a third pixel electrode part and a fourth pixel electrode part;
the first pixel driving circuit is connected to the first pixel electrode part, the second pixel driving circuit is connected to the second pixel electrode part, the third pixel driving circuit is connected to the third pixel electrode part, and the fourth pixel driving circuit is connected to the fourth pixel electrode part; and in a same pixel unit, the first pixel electrode part, the second pixel electrode part, the third pixel electrode part, and the fourth pixel electrode part are arranged in a two-by-two matrix.

5. The display panel according to claim 4, wherein in the same pixel unit:

the first pixel electrode part and the third pixel electrode part are arranged adjacently in the first direction, the first pixel electrode part and the second pixel electrode part are arranged adjacently in a second direction, and the first direction is intersected with the second direction;

a first notch is formed at a corner of the first pixel electrode part facing the third pixel electrode part and away from the second pixel electrode part;

a second notch formed at a corner of the second pixel electrode part facing the fourth pixel electrode part and away from the first pixel electrode part;

a third notch is formed at a corner of the third pixel electrode part facing the first pixel electrode part and away from the fourth pixel electrode part;

a fourth notch formed at a corner of the fourth pixel electrode part facing the second pixel electrode part and away from the third pixel electrode part; and the plurality of pixel units comprises a first pixel unit and a second pixel unit adjacent in the second direction, and wherein the first notch and the third notch of the first pixel unit is disposed adjacent to the second notch and the fourth notch of the second pixel unit, and the first notch and the third notch of the first pixel unit and the second notch and the fourth notch of the second pixel unit are configured to form the second opening.

6. The display panel according to claim 5, wherein the pixel electrode layer further comprises:

a transiting part, wherein an orthographic projection of the transiting part on the base substrate is within the orthographic projection of the second opening on base substrate, and the transiting part is connected to the first conductive part via a third through hole, wherein the through-hole contacting part is connected to the transiting part via the first through hole, to connect to the first conductive part.

7. The display panel according to claim 6, wherein both the orthographic projection of the first through hole on base substrate and an orthographic projection of the third through hole on base substrate have a square shape.

8. The display panel according to claim 3, wherein a second electrode of the driving transistor is connected to a first power supply terminal, the pixel driving circuit further comprises a first transistor and a second transistor, a first electrode of the first transistor is connected to a gate electrode of the driving transistor, a second electrode of the first transistor is connected to a data signal terminal, a first electrode of the second transistor is connected to a reference signal terminal, and a second electrode of the second transistor is connected to the first electrode of the driving transistor, the second conductive layer further comprises:

a power supply line, an orthographic projection of the power supply line on the base substrate is extended in a second direction, the power supply line is configured to provide the first power supply terminal, in the first direction, the orthographic projection of the power supply line on the base substrate is positioned between orthographic projections of adjacent two pixel units on the base substrate, and the first direction is intersected with the second direction;

a first data line, wherein an orthographic projection of the first data line on the base substrate is extended in the second direction, the first data line is configured to provide the data signal terminal to a first pixel driving circuit, and the orthographic projection of the first data line on the base substrate is positioned between an orthographic projection of the first pixel driving circuit on the base substrate and an orthographic projection of a second pixel driving circuit on the base substrate;

a second data line, wherein an orthographic projection of the second data line on the base substrate is extended in the second direction, the second data line is configured to provide the data signal terminal to the second pixel driving circuit, and the orthographic projection of the second data line on the base substrate is positioned between the orthographic projection of the first pixel driving circuit on the base substrate and the orthographic projection of the second pixel driving circuit on the base substrate;

a third data line, wherein an orthographic projection of the third data line on the base substrate is extended in the second direction, the third data line is configured to provide the data signal terminal to a third pixel driving circuit, and the orthographic projection of the third data line on the base substrate is positioned between an orthographic projection of the third pixel driving circuit on the base substrate and an orthographic projection of a fourth pixel driving circuit on the base substrate;

a fourth data line, wherein an orthographic projection of the fourth data line on the base substrate is extended in the second direction, the fourth data line is configured to provide the data signal terminal to the fourth pixel driving circuit, and the orthographic projection of the third data line on the base substrate is positioned between the orthographic projection of the third pixel driving circuit on the base substrate and the orthographic projection of the fourth pixel driving circuit on the base substrate; and a reference signal line, wherein an orthographic projection of the reference signal line on the base substrate is extended in the second direction, the reference signal line is configured to provide the reference signal terminal to a same pixel unit, and the orthographic projection of the reference signal line on the base substrate is positioned between the orthographic projection of the second pixel driving circuit on the base substrate and the orthographic projection of the third pixel driving circuit on the base substrate.

9. The display panel according to claim 1, wherein the first conductive part is overlapped on all area of the display panel other than an area where the first opening is located.

10. The display panel according to claim 1, further comprising:

an active layer, disposed between the base substrate and the second conductive layer, wherein the active layer comprises a first active part comprising a first sub active part, wherein the first sub active part is configured to from a channel region of the driving transistor; and a light shielding layer, disposed between the base substrate and the active layer, wherein the light shielding layer comprises a first light shielding part, and an orthographic projection of the light shielding part on the base substrate is covered on an orthographic projection of the first sub active part on the base substrate.

11. The display panel according to claim 10, wherein the pixel driving circuit further comprises a capacitor, a first electrode of the capacitor is connected to the first electrode of the driving transistor, and a second electrode of the capacitor is connected to a gate electrode of the driving transistor, wherein the display panel further comprises:

a first conductive layer, disposed between the active layer and the second conductive layer, wherein the first conductive layer comprises a third conductive part, an orthographic projection of the third conductive part on the base substrate is covered on an orthographic projection of the first active part on the base substrate, and the third conductive part is configured to form the gate electrode of the driving transistor, wherein the second conductive layer further comprises:

a fourth conductive part, connected to the third conductive part via a through hole, wherein the fourth conductive part is configured to form the second electrode of the capacitor, wherein the first active part further comprises:

a second sub active part, connected to the first sub active part, wherein an orthographic projection of the second sub active part on the base substrate is at least partly overlapped with an orthographic projection of the fourth conductive part on the base substrate, and the second sub active part is configured to form the first electrode of the capacitor.

12. The display panel according to claim 11, wherein the first light shielding layer is a conductive layer, an orthographic projection of the light shielding part on the base substrate is at least partly overlapped with an orthographic projection of the fourth conductive layer on the base substrate, and the second active part is connected to the first light shielding part via a through hole.

13. The display panel according to claim 11, wherein a second electrode of the driving transistor is connected to a first power supply terminal, and the active layer further comprises:

an active line, wherein an orthographic projection of the active line on the base substrate is extended in the first direction, the active line is connected to a plurality of first sub active part spaced along the first direction, and the active line is connected to a side of the first sub active part away from the second sub active part, wherein the second conductive layer further comprises:

a power supply line, configured to provide the first power supply terminal, wherein an orthographic projection of the power supply line on the base substrate is extended in the second direction, and the power supply line is connected to the active line via a though hole.

14. The display panel according to claim 13, wherein the second direction is a column direction, and wherein the display panel comprises a plurality of columns of pixel units, and each column of the pixel units corresponds to one of the power supply line.

15. The display panel according to claim 13, wherein the second conductive layer comprises a plurality of power supply lines, and the light shielding layer further comprises:

a plurality of first connecting lines, wherein an orthographic projection of each first connecting line on the base substrate is extended in the first direction and is spaced along the second direction, and each power supply line is connected to a same first connecting line via a though hole.

16. The display panel according to claim 13, wherein the pixel driving circuit further comprises a first transistor, a first electrode of the first transistor is connected to the gate electrode of the driving transistor, and the active layer further comprises:

a second active part, wherein an orthographic projection of the second active part on the base substrate is at a side of the orthographic projection of the active line on the base substrate away from the orthographic projection of the fourth conductive part on the base substrate, and a part of the second active part is configured to form a channel region of the first transistor, wherein the second conductive layer further comprises:

a bridging part, the bridging part is connected to the fourth conductive part, and the bridging part is connected to the second active part via a through hole, wherein a size of an orthographic projection of the bridging part on the base substrate in the first direction is smaller than a size of the orthographic projection of the fourth conductive part on the base substrate in the first direction.

17. The display panel according to claim 16, wherein the active line comprises a first active line and a second active line alternately connected in the first direction, a size of an orthographic projection of the first active line on the base substrate in the second direction is smaller than an orthographic projection of the second active line on the base substrate in the second direction, and the orthographic projection of the first active line on the base substrate is intersected with the orthographic projection of the bridging part on the base substrate.

18. The display panel according to claim 11, wherein the first driving circuit further comprises a second transistor, a first electrode of the second transistor is connected to a reference signal terminal, a second electrode of the second transistor is connected to the first electrode of the driving transistor, and the first active part further comprises:

a third sub active part, connected to a side of the second sub active part away from the first sub active part, wherein the third sub active part is configured to form a channel region of the second transistor; and a fourth sub active part, connected to a side of the third sub active part away from the second sub active part, wherein the light shielding layer further comprises:

a plurality of second connecting segments, wherein the display panel comprises a plurality of pixel units, and each pixel unit is provided with a corresponding second connecting segments, and wherein in a same pixel unit, each fourth sub active part is connected to its corresponding second connecting segment via a through hole, wherein the first conductive layer further comprises:

a fifth conductive part, connected to the second connecting segment via a through hole, and wherein the second conductive layer further comprises:

a reference signal line, connected to the fifth conductive part via a through hole, wherein the reference signal line is configured to provide the reference signal terminal.

19. A display device, comprising the display panel according to claim 1.

* * * * *